United States Patent [19]
Graef et al.

[11] Patent Number: 6,037,796
[45] Date of Patent: Mar. 14, 2000

[54] CURRENT WAVEFORM ANALYSIS FOR TESTING SEMICONDUCTOR DEVICES

[75] Inventors: Stefan Graef, Milpitas; Emery Sugasawara, Pleasanton, both of Calif.

[73] Assignee: LSI Logic Corp., Milpitas, Calif.

[21] Appl. No.: 08/882,524

[22] Filed: Jun. 25, 1997

[51] Int. Cl.[7] ................................................. G01R 31/28
[52] U.S. Cl. .................... 324/765; 324/158.1; 714/736
[58] Field of Search .................... 324/765–769, 324/158.1; 371/25.1, 26; 714/736

[56] References Cited

U.S. PATENT DOCUMENTS

| | | | |
|---|---|---|---|
| 5,043,910 | 8/1991 | Chiba | 714/736 X |
| 5,592,077 | 1/1997 | Runas et al. | 324/158.1 |
| 5,670,892 | 9/1997 | Sporck | 324/158.1 X |
| 5,731,700 | 3/1998 | McDonald | 324/158.1 |
| 5,731,984 | 3/1998 | Ullmann . | |
| 5,926,486 | 7/1999 | Siulinski | 324/765 X |

*Primary Examiner*—Gerard Strecker

[57] ABSTRACT

A method of testing a semiconductor device includes generating a current waveform for the semiconductor device by measuring the response of the device to an initializing vector group and comparing the current waveform to a golden waveform to determine whether the semiconductor device is good or defective. Apparatus for testing the semiconductor device includes a vector generator providing an initialization vector group to the semiconductor device, a measurement unit for measuring a plurality of current measurements from the semiconductor device which responds to the input of the initialization vector group, a generation unit for generating a current waveform from the current measurements of the semiconductor device, and an analysis unit for comparing the current waveform to a golden waveform to determine whether the device falls outside a tolerance margin of the golden waveform.

22 Claims, 4 Drawing Sheets

CURRENT WAVEFORM ANALYSIS FOR TESTING SEMICONDUCTOR DEVICES

BACKGROUND OF THE INVENTION

The disclosure herein relates generally to testing semiconductor devices and more particularly to a method and apparatus for testing and measuring the current drawn by Integrated Circuits (IC) after initialization.

A single point current measurement analysis is typically performed to test an IC for defects according to the known method called the $I_{DD}$ test, which is well known in the art. The known method involves initializing the device under test (DUT) and then allowing the current to reach a stable value. When an "ideal" device reaches a stable value, the logic circuits, which are contained in the ideal device, draw negligible or no current. Once the DUT has reached a stable value, a measurement is taken to determine how much current, if any, the logic circuits are drawing. This measurement is compared to standard values to determine if the DUT is defective.

Before taking a measurement the DUT must be initialized. The initialization process involves powering up the DUT and inputting a series of different stimulus vectors to the inputs of the DUT. The vectors, which are binary strings, are used to create different logical states in the DUT.

After the last initialization vector is supplied, the DUT is given a predetermined period of time to reach a "static" state; this time is typically 1 msec. After the predetermined period of time has elapsed the DUT will be at a stable value. Once the DUT reaches the stable value, a single measurement, called the stable value current ($I_{DDQ}$), is taken using a Precision Measurement Unit (PMU). The PMU measures the current being drawn by the logic circuits. Only one measurement is taken once the predetermined period of time has lapsed. This measurement is then compared to a standard value designated as the "good/bad limit" for that particular device. Based on the result of this comparison the DUT will either be good or defective.

When using the known method, it is possible that a defective DUT will not be detected because during the settling period the PMU does not take any measurements. The known method of testing ignores the behavior of the DUT during the settling period. The DUT is given a predetermined period of time to settle and reach a stable value. Once the predetermined period of time has elapsed and the DUT has reached a stable value, the PMU will measure the current drawn by the DUT. According to the known method of testing, no measurements occur during the settling period. The PMU takes the measurement at the stable value and this result is compared to a standard value. Thus, the measurement is only an indication of the DUTs behavior at one point in time; it does not indicate how the DUT behaved during the settling period. Given sufficient time, it is possible for a defective DUT to settle to the same level as a good device. Consequently, a measurement taken after the DUT reaches a stable value is not the best indicator of the DUT's quality.

If only a single measurement is used to determine the quality of a DUT, a defective DUT may not be detected because the known method of testing ignores the DUT's behavior during the settling period. Additionally, this wastes tester time because defective devices are not detected.

Therefore, what is needed is a method and apparatus that measures the response of the DUT over a period of time, including the settling period, to create a current waveform of the DUT's performance.

SUMMARY OF THE INVENTION

An embodiment of the present invention, accordingly, provides a method for testing and measuring the response of a semiconductor device, called a DUT, after initialization, to create a current waveform of the DUT's response in order to determine if the DUT is defective. To this end, a method of testing a semiconductor device includes generating a current waveform for the semiconductor device by measuring the response of the semiconductor device to a initialization vector group and comparing the current waveform to a golden waveform in order to determine if the device is good or defective. Another embodiment provides an apparatus for testing a semiconductor device, which requires a vector generator providing an initialization vector group to the semiconductor device, a measurement unit for measuring a plurality of current measurements from the semiconductor device which responds to the input of the initialization vector group, a generation unit for generating a current waveform from the current measurements of the semiconductor device, and an analysis unit for comparing the current waveform to a golden waveform to determine whether the device falls outside a tolerance margin of the golden waveform.

The principal advantage of these embodiments is that it measures the response over a period of time, including the settling period, to create a waveform of the DUT's characteristics. The measurement will begin at a predetermined time and continue at least until the time the DUT has reached a stable value. The measurements are then combined to create a current waveform of the DUTs behavior during the settling period. The current waveform is then compared to a golden waveform for that particular device to get an accurate indication of whether the DUT is defective. The apparatus allows an operator to identify a variety of faults during the $I_{DDQ}$ measurement and improves the accuracy of the testing procedure. Furthermore, additional failures would be observable because the waveform comparison test is utilized.

DETAILED DESCRIPTION OF THE PREFERRED EMBODIMENT

Figure 1:
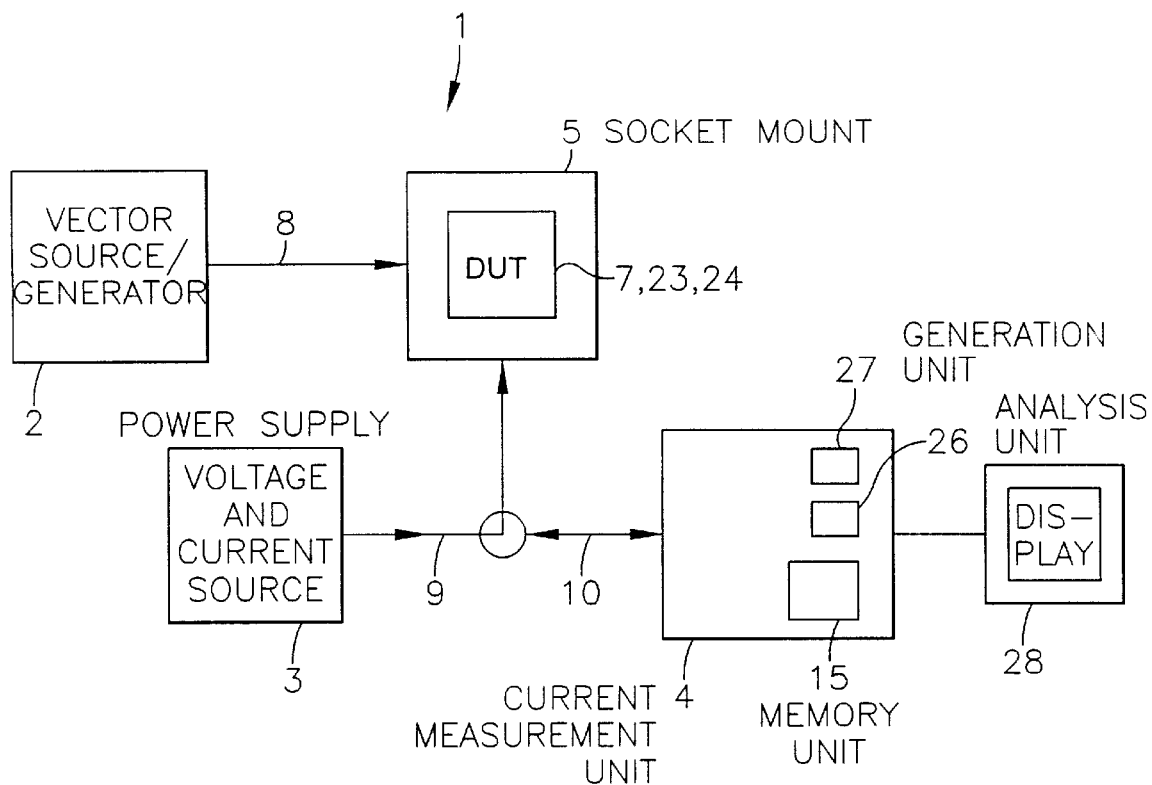
FIG. 1 is a block diagram illustrating an embodiment of a measuring unit capable of testing semiconductor devices.

Referring to FIG. 1, a measuring apparatus is depicted and generally designated 1. The measuring apparatus 1 includes a vector generator 2, a power supply source 3, a current measurement unit 4, and a socket mount 5. Initially, a device under test (DUT) 7 is mounted onto the socket mount 5 and powered up by power supply 3 via a power path 9. Vector generator 2 generates an initializing vector group, containing a set number of vectors. Each vector is made up of a binary string, which is used to test the logic circuits of DUT 7. The number of bits contained in each vector corresponds to the number of pins for DUT 7. Additionally, each vector is typically different from all other vectors within the initialization vector group. Vector generator 2 inputs the initialization vector group into DUT 7 through the socket mount 5, via a vector path 8. The inputting process is continued until all the vectors forming the initialization vector group are input into DUT 7. The exact number of vectors, which form the initialization vector group, depend on DUT 7. At some point in time current measurement unit 4 is activated and it monitors power path 9 via a measurement path 10 and measures the response of DUT 7. The measurements, which are taken by current measurement unit 4, are stored in a memory unit 15.

Figure 3:
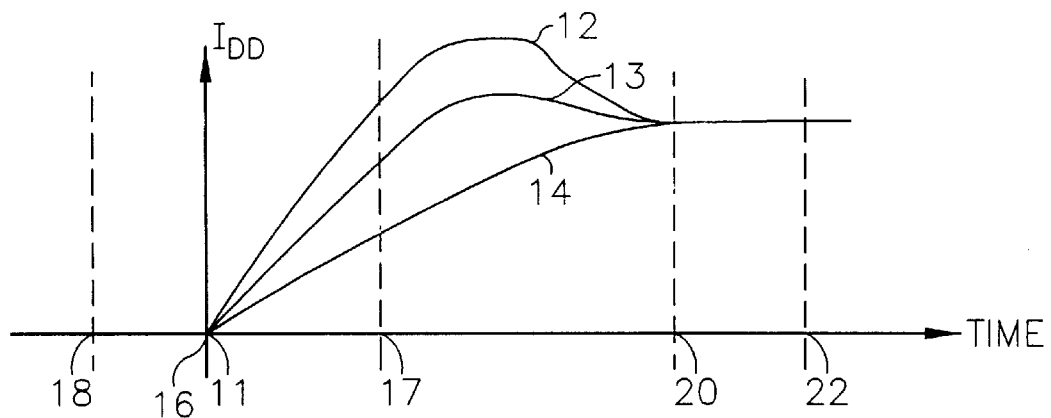
FIG. 3 is a graph illustrating an embodiment of the current waveforms depicting the response of different DUTs tested with the same initialization vector group.

Referring to FIG. 3, a graph of the current waveforms depicts the response of different DUTs tested with the same initialization vector group. In one embodiment, current measurement unit 4 is activated at a beginning time designated 11 corresponding to a time one designated 16. Time one 16 corresponds to the time at which the last vector in the initialization vector group is input into DUT 7. This allows current measurement unit 4 to measure the current drawn by DUT 7 over a period of time starting at beginning time 11 and stopping at an ending time designated 22, which is typically at some designated time after a time stable designated 20. In another embodiment, current measurement unit 4 is activated at beginning time 11 corresponding to a time two designated 17. Time two 17 is prior to time stable 20 but after time one 16. In another embodiment, current measurement unit 4 is activated at a time three designated 18. Time three 18 is prior to time one 16. Consequently, the shape of current waveform 12 for DUT 7 will depend on the actual time at which current measurement unit 4 is activated. Likewise, the shape of a pair of current waveforms 13 and 14 corresponding to a pair of DUTs 23 and 24, in FIG. 1, will depend on the actual time at which current measurement unit 4 is activated. A generation unit 27, shown in FIG. 1, plots the measurements stored in memory unit 15 for each DUT as a function of time to generate the current waveform 12 for DUT 7, as shown in FIG. 3.

Figure 2:
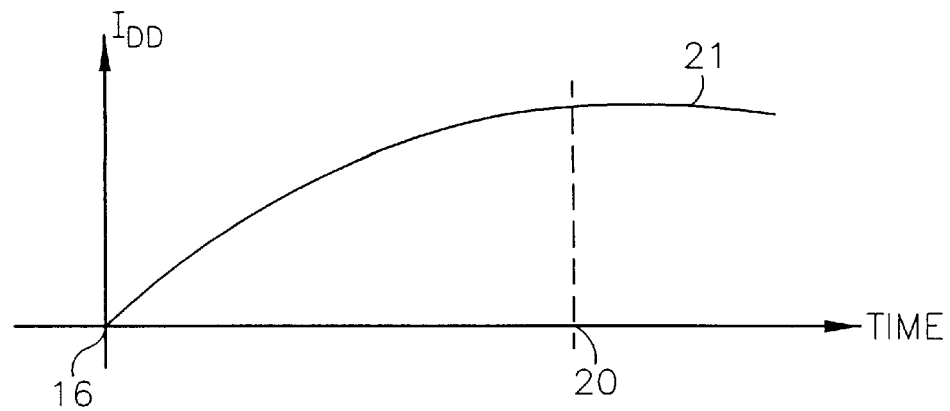
FIG. 2 is a graph illustrating an embodiment of a golden waveform depicting the response of an ideal semiconductor device to an initialization vector group.

Referring now to FIG. 2, a graph of a golden waveform 21 depicts the response of an ideal semiconductor device to the initialization vector group. In order to determine whether DUT 7 is good or defective, current waveform 12 for DUT 7, as shown in FIG. 3, must be compared to golden waveform 21. Golden waveform 21 is created by calculating the response of an ideal device to the same initialization vector group utilized to generate current waveform 12 for DUT 7. Generation unit 27 plots the measurements, for the ideal device, as a function of time to create golden waveform 21. Golden waveform 21 can be displayed, on a display unit 28, shown in FIG. 1, stored in memory unit 15, also shown in FIG. 1, or simultaneously displayed and stored for comparison to the corresponding current waveform of the DUTs that are similar to the ideal device.

Figure 4:
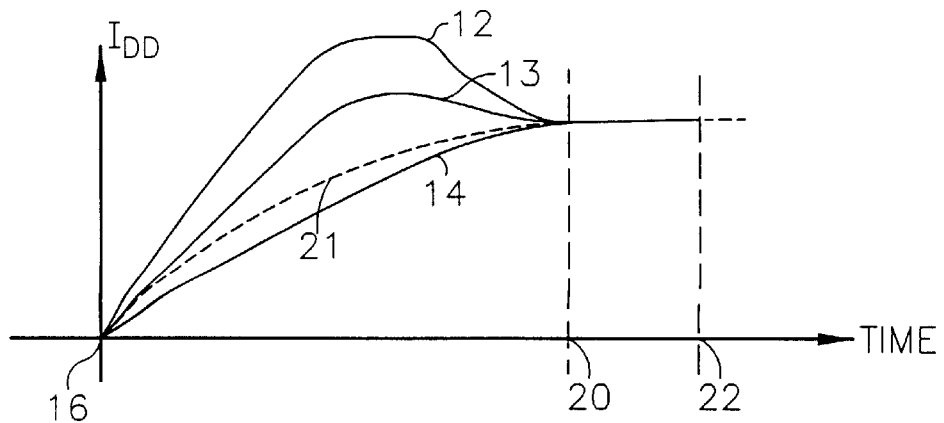
FIG. 4 is a graph illustrating a combination of the embodiments of FIG. 2 and FIG. 3 for comparing the current waveforms for different DUTs to a golden waveform generated utilizing the same initialization vector group.

Referring now to FIG. 4, a graph depicts the comparison between golden waveform 21 and current waveforms 12, 13, and 14 for DUTs 7, 23, and 24, respectively. Memory unit 15, capable of storing numerous current waveforms, stores current waveforms 12, 13, and 14, which were plotted by generation unit 27. Additionally, current waveforms 12, 13, 14 and golden waveform 21 can also be simultaneous displayed using display unit 28. An analysis unit 26, in FIG. 1, retrieves current waveforms 12, 13, and 14 for DUTs 7, 23, and 24, respectively, from memory unit 15. Then, analysis unit 26 can simultaneously compare each current waveform to golden waveform 21 in order to generate a test result. Consequently, analysis unit 26 can determine whether the test result, for each particular DUT, falls within an allowable tolerance margin (discussed below). If analysis unit 26 determines that the test result for a particular DUT falls within the allowable tolerance margin, then the DUT is assigned a final value, from a pair of result values, that corresponds to a good device. Otherwise, analysis unit 26 assigns the DUT a different final value, from the pair of result values, that corresponds to a defective device.

Figure 5:
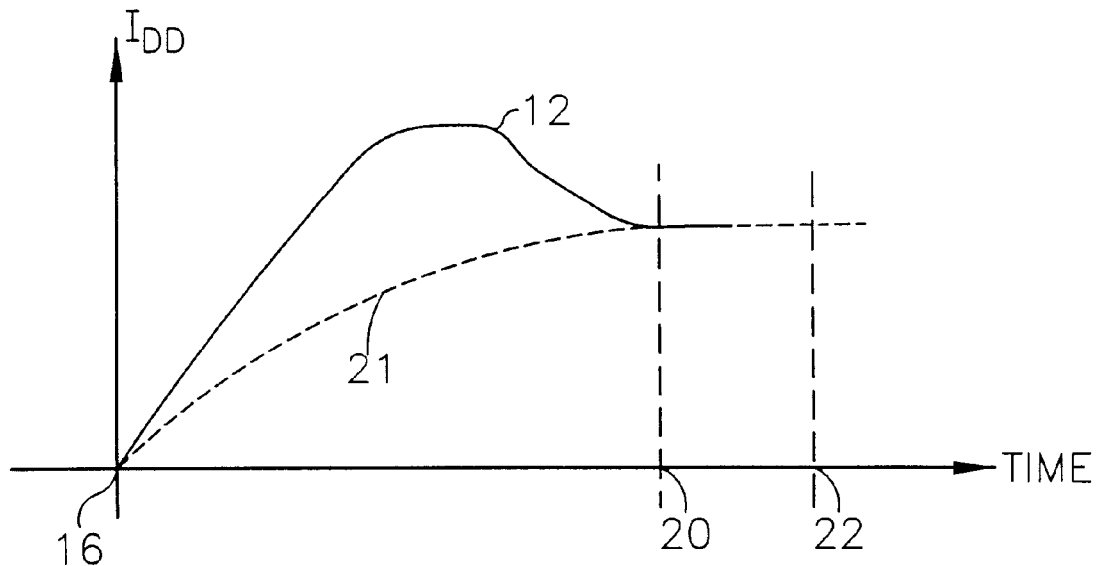
FIG. 5 is a graph illustrating an embodiment of a single current waveform depicting the response of a DUT and a corresponding golden waveform.

Alternatively, the results for each DUT, for example current waveform 12 for DUT 7, can be compared to golden waveform 21, independently, as shown in FIG. 5. Additionally, current waveform 12 and golden waveform 21 can be displayed on display unit 28 independent of other current waveforms.

Figure 7:
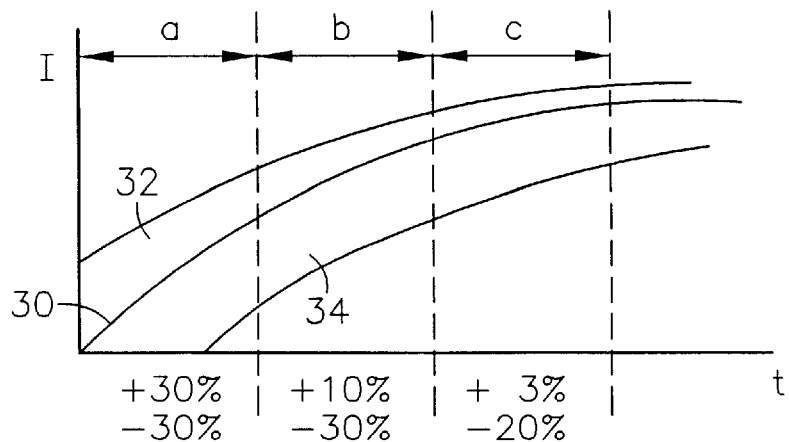
FIGS. 7, 8 and 9 are graphs illustrating embodiments of golden waveforms representing various chips, each including a different transistor combination, and a tolerance area above and below each waveform.
Figure 8:
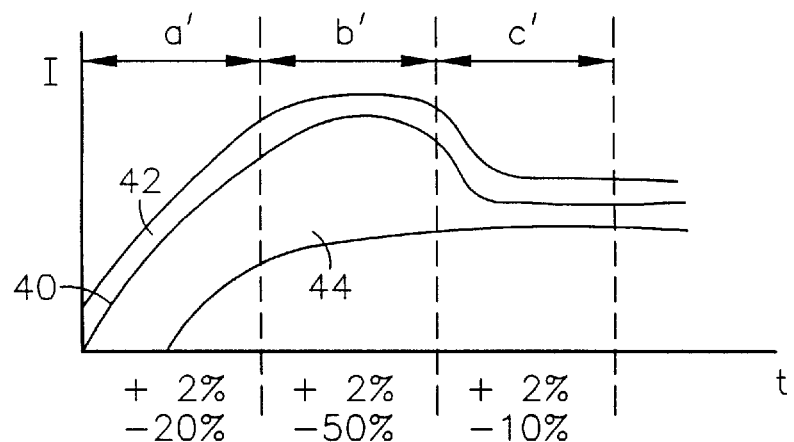
Figure 9:
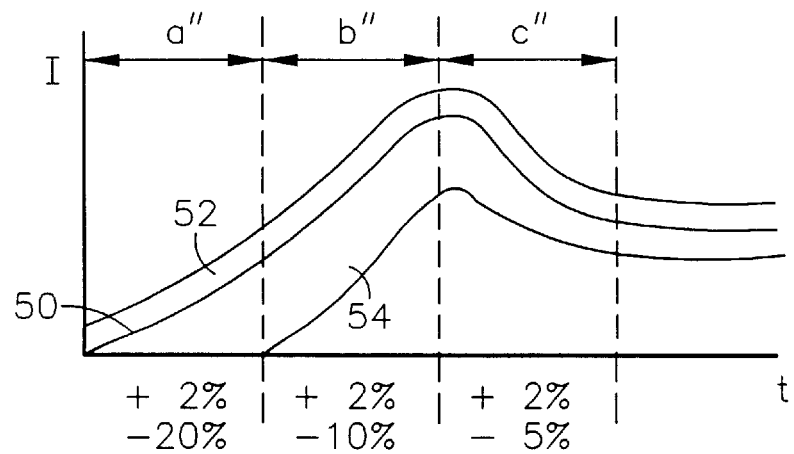

For example, in FIGS. 7, 8 and 9, various golden waveforms are plotted on graphs wherein a "y" coordinate represents current (I) and an "x" coordinate represents time (t). Each of the golden waveforms are exemplary representations of various chips, each including a different transistor combination. A tolerance area above and below the golden waveform is illustrated. The tolerance area may be either constant or variable with respect to the associated golden waveform as discussed in further detail below.

In FIG. 7, a golden waveform 30 is illustrated for a first combination including an upper tolerance area 32 and a lower tolerance area 34. The upper tolerance area 32 varies with respect to golden waveform 30 in three sequential periods of time a, b and c by +30%, +10% and +3%, respectively, whereas the lower tolerance area 34 varies with respect to the golden waveform 30 in the same periods by −30%, −30% and −20%, respectively.

In FIG. 8, a golden waveform 40 is illustrated for a second combination including an upper tolerance area 42 and a lower tolerance area 44. The upper tolerance area 42 remains constant with respect to golden waveform 40 throughout three sequential time periods a', b' and c' at +2%, whereas the lower tolerance area 44 varies with respect to the golden waveform 40 in the same periods by −20%, −50% and −10%, respectively.

In FIG. 9, a golden waveform 50 is illustrated for a third combination including an upper tolerance area 52 and a lower tolerance area 54. The upper tolerance area 52 remains constant with respect to golden waveform 50 throughout three sequential periods of time a", b" and c" at +2%, whereas the lower tolerance area 54 varies with respect to the golden waveform 50 in the same periods by −20%, −10% and −5%, respectively.

Figure 6:
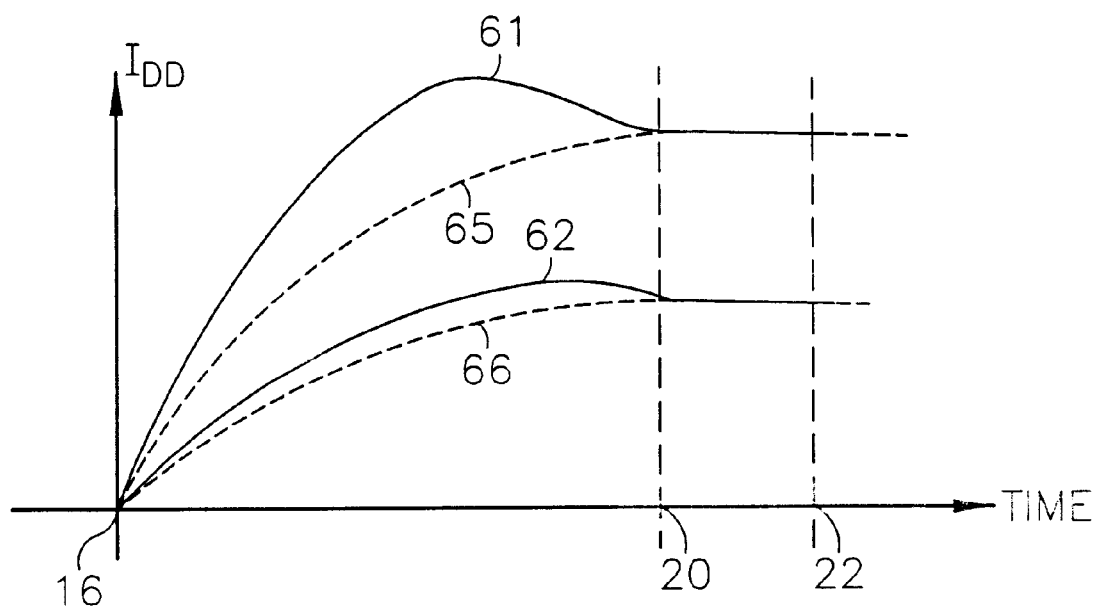
FIG. 6 is a graph illustrating an embodiment of multiple current waveforms depicting the response of a single DUT to different initialization vector groups and corresponding golden waveforms.

Referring now to FIG. 6, a graph of current waveforms depicts the responses of a single DUT to different initialization vector groups and corresponding golden waveforms. Initialization vector groups can differ by altering the order of the vectors within a particular initialization vector group, by generating new vectors to replace existing vectors in a particular initialization vector group, or by a combination of altering the order of the vectors and replacing existing vectors. Each new initialization vector group results in a new and unique response from DUT 7. Inputting at least one other initialization vector group into DUT 7 will produce at least one other corresponding current waveform. Therefore, in another embodiment two different initialization vector groups are input into DUT 7 to generate a pair of current waveforms 61 and 62. Current measurement unit 4 measures the response of DUT 7 to each of these initialization vector groups. These measurements are stored in memory unit 15 for later retrieval. Generation unit 27 retrieves the information from memory unit 15 and generates current waveforms 61 and 62. Furthermore, if at least one other initialization vector group is utilized to initialize DUT 7, then a second golden waveform must be generated, which corresponds to the other initialization vector group. Therefore, generation unit 27 must generate a pair of golden waveforms 65 and 66, corresponding to the response of the ideal device to each of the two initialization vector groups. Analysis unit 26 can take current waveforms 61 and 62 and compare each current waveform to its corresponding golden waveform 65 and 66, respectively, to generate a pair of test results. Consequently, analysis unit 26 can determine if the DUT is good or defective under the different testing conditions. Display unit 28 can also display current waveforms 61 and 62 with the corresponding golden waveforms 65 and 66.

Although illustrative embodiments of the invention have been shown and described, a wide range of modifications, changes and substitutions are contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A method of testing a semiconductor device comprising:
    generating a current waveform for said semiconductor device by measuring a level of current drawn by said semiconductor device over a period of time, starting with a predetermined beginning time and ending with a predetermined end time, in response to said semiconductor device receiving an initialization vector group, said current waveform representing said level of current drawn by said semiconductor device over the period of time; and
    comparing said current waveform for said semiconductor device to a golden waveform, said semiconductor device being defective if said current waveform for said semiconductor device falls outside a tolerance margin of said golden waveform.

2. The method of testing a semiconductor device as defined in claim 1 wherein the step of generating a current waveform further comprises the step of storing said current waveform in a memory unit.

3. The method of testing a semiconductor device as defined in claim 2 wherein said predetermined beginning time is when said semiconductor receives said initialization vector group.

4. The method of testing a semiconductor device as defined in claim 2 wherein said predetermined beginning time is after said semiconductor receives said initialization vector group.

5. The method of testing a semiconductor device as defined in claim 2 wherein said predetermined beginning time is before said semiconductor receives said initialization vector group.

6. The method of testing a semiconductor device as defined in claim 2 wherein the step of initializing comprises the step of inputting said initialization vector group into said semiconductor device.

7. The method of testing a semiconductor device as defined in claim 2 further comprising the step of calculating response of an ideal semiconductor device to said initialization vector group, said ideal semiconductor device corresponding to said semiconductor device.

8. The method of testing a semiconductor device as defined in claim 7 wherein the step of calculating comprises the steps of:
    inputting said initialization vector group into said ideal semiconductor device;
    measuring response of said ideal semiconductor device to said initialization vector group to generate said golden waveform; and
    storing said golden waveform in said memory unit.

9. The method of testing a semiconductor device as defined in claim 1 further comprising the steps of:
    determining whether said current waveform falls within a tolerance margin; and
    assigning a final value, from a pair of result values, to said semiconductor device.

10. The method of testing a semiconductor device as defined in claim 1 wherein the tolerance margin includes a first tolerance area for defining acceptable values exceeding the golden waveform and a second tolerance area for defining acceptable values less than the golden waveform.

11. The method of testing a semiconductor device as defined in claim 10 wherein the step of initializing comprises the steps of:
    generating said other initialization vector group; and
    inputting said other initialization vector group into said semiconductor device.

12. The method of testing a semiconductor device as defined in claim 10 further comprising the steps of:
    determining whether said result falls within a tolerance margin; and
    assigning a final value from a pair of result values to said semiconductor device.

13. The method of testing a semiconductor device as defined in claim 10 further comprising the step of calculating response of an ideal semiconductor device to said other initialization vector group, said ideal semiconductor device corresponding to said semiconductor device.

14. The method of testing a semiconductor device as defined in claim 13 wherein the step of calculating comprises the steps of:
    inputting said other initialization vector group into said ideal semiconductor device;
    measuring the response of said ideal semiconductor device to said other initialization vector group, starting at said predetermined beginning time, to generate said second golden waveform; and
    storing said second golden waveform in a memory unit.

15. The method of testing a semiconductor device as defined in claim 14 further comprising the step of simultaneously displaying said golden waveform and said current waveform.

16. An apparatus for testing a semiconductor device comprising:
    a vector generator for providing an initialization vector group to said semiconductor device;
    a measurement unit for taking a plurality of current measurements over a period of time, starting with a predetermined beginning time and ending with a predetermined end time, from said semiconductor device, said current measurements representing a level of current drawn by said semiconductor device in response to said semiconductor device receiving said initialization vector group;

a generation unit for generating a current waveform from the current measurements of said semiconductor device; and an analysis unit for comparing said current waveform for said semiconductor device to a golden waveform, said semiconductor device being defective if said current waveform for said semiconductor device falls outside a tolerance margin of said golden waveform.

17. The apparatus for testing a semiconductor device as defined in claim 16 further comprising:

a memory unit storing said plurality of current measurements, the current waveform and the golden waveform; and a display unit, said display unit retrieving said current waveform and said golden waveform from said memory unit and representing said current waveform and said golden waveform simultaneously.

18. The apparatus for testing a semiconductor device as defined in claim 16 wherein said predetermined beginning time is when said semiconductor receives said initialization vector group.

19. The apparatus for testing a semiconductor device as defined in claim 16 wherein said predetermined beginning time is after said semiconductor receives said initialization vector group.

20. The apparatus for testing a semiconductor device as defined in claim 16 wherein said predetermined beginning time is before said semiconductor receives said initialization vector group.

21. The method of claim 1, wherein the predetermined end time is when the semiconductor device has reached a static state corresponding to a time stable.

22. The apparatus of claim 16, wherein the predetermined end time is when the semiconductor device has reached a static state corresponding to a time stable.

* * * * *